United States Patent
Saito et al.

(10) Patent No.: US 9,837,488 B2
(45) Date of Patent: Dec. 5, 2017

(54) SEMICONDUCTOR DEVICE

(71) Applicant: Kabushiki Kaisha Toshiba, Minato-ku (JP)

(72) Inventors: Hisashi Saito, Kawasaki (JP); Masahiko Kuraguchi, Yokohama (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/612,471

(22) Filed: Feb. 3, 2015

(65) Prior Publication Data
US 2015/0263153 A1    Sep. 17, 2015

(30) Foreign Application Priority Data

Mar. 14, 2014    (JP) ................................ 2014-051812

(51) Int. Cl.
*H01L 29/778*    (2006.01)
*H01L 29/205*    (2006.01)
(Continued)

(52) U.S. Cl.
CPC ...... *H01L 29/0634* (2013.01); *H01L 29/0847* (2013.01); *H01L 29/7786* (2013.01);
(Continued)

(58) Field of Classification Search
CPC ............. H01L 29/2003; H01L 29/2008; H01L 29/4236; H01L 29/4238; H01L 29/7786
See application file for complete search history.

(56) References Cited

U.S. PATENT DOCUMENTS

| | | | |
|---|---|---|---|
| 2009/0114948 A1 | 5/2009 | Ishida | |
| 2012/0146097 A1* | 6/2012 | Endo | H01L 29/42356 257/194 |

(Continued)

FOREIGN PATENT DOCUMENTS

| | | |
|---|---|---|
| JP | 2004-327766 | 11/2004 |
| JP | 2009-117485 | 5/2009 |

(Continued)

OTHER PUBLICATIONS

Tohru Oka and Tomohiro Nozawa, "AlGaN/GaN recessed MIS-Gate HFET with High-Threshold-Voltage Normally-Off Operation for Power Electronics Applications," Jul. 2008, IEEE Electron Device Letters, vol. 29, No. 7, pp. 668-670.*

(Continued)

*Primary Examiner* — Michael Carter
(74) *Attorney, Agent, or Firm* — Oblon, McClelland, Maier & Neustadt, L.L.P.

(57) ABSTRACT

According to one embodiment, a semiconductor device includes a first semiconductor layer; a second semiconductor layer having a larger band gap than the first semiconductor layer; a third semiconductor layer having a smaller band gap than the second semiconductor layer; a first electrode being in contact with the third semiconductor layer; a second electrode being in contact with the third semiconductor layer; and a third electrode provided between the third semiconductor layer in contact with the first electrode, the second semiconductor layer directly below the first electrode, and the first semiconductor layer directly below the first electrode, and the third semiconductor layer in contact with the second electrode, the second semiconductor layer directly below the second electrode, and the first semiconductor layer directly below the second electrode, being in contact with the third semiconductor layer, the second (Continued)

semiconductor layer, and the first semiconductor layer via insulating film.

16 Claims, 9 Drawing Sheets

(51) Int. Cl.
    *H01L 29/20*     (2006.01)
    *H01L 29/06*     (2006.01)
    *H01L 29/08*     (2006.01)
    *H01L 29/423*     (2006.01)
    *H01L 29/15*     (2006.01)

(52) U.S. Cl.
    CPC ........ *H01L 29/155* (2013.01); *H01L 29/2003* (2013.01); *H01L 29/4236* (2013.01); *H01L 29/4238* (2013.01)

(56) References Cited

U.S. PATENT DOCUMENTS

| | | | |
|---|---|---|---|
| 2012/0218783 A1* | 8/2012 | Imada | .................. H01L 29/402 363/17 |
| 2013/0062611 A1* | 3/2013 | Ikeda | .................. H01L 29/861 257/76 |
| 2013/0105812 A1 | 5/2013 | Ishigaki et al. | |
| 2013/0161765 A1 | 6/2013 | Sonoyama et al. | |
| 2013/0271208 A1 | 10/2013 | Then et al. | |

FOREIGN PATENT DOCUMENTS

| | | |
|---|---|---|
| JP | 2009-231458 | 10/2009 |
| JP | 2010-239064 | 10/2010 |
| JP | 2011-124509 | 6/2011 |
| JP | 2011-238654 | 11/2011 |
| JP | 2012-124440 | 6/2012 |
| JP | 2013-98284 | 5/2013 |
| JP | 2013-105994 | 5/2013 |
| JP | 2013-135055 | 7/2013 |
| JP | 2013-207166 | 10/2013 |

OTHER PUBLICATIONS

Hidetoshi Ishida, et al., "Unlimited High Breakdown Voltage by Natural Super Junction of Polarized Semiconductor", IEEE Electron Device Letters, vol. 29, No. 10, Oct. 2008, pp. 1087-1089.
Hidetoshi Ishida, et al., "GaN-based Natural Super Junction Diodes with Multi-channel Structures", IEDM, 2008, 4 pages.

* cited by examiner

SEMICONDUCTOR DEVICE

CROSS-REFERENCE TO RELATED APPLICATIONS

This application is based upon and claims the benefit of priority from Japanese Patent Application No. 2014-051812, filed on Mar. 14, 2014; the entire contents of which are incorporated herein by reference.

FIELD

Embodiments described herein relate generally to a semiconductor device.

BACKGROUND

For high breakdown voltage and low on-resistance of semiconductor devices, it is advantageous to use a material having high critical electric field. Nitride semiconductors have high critical electric field intensity. Thus, a semiconductor device achieving high breakdown voltage and low on-resistance is obtained by using such nitride semiconductors.

In a nitride semiconductor device, the electric field may concentrate at an edge of the gate electrode or an edge of the field plate electrode. This may hamper effective use of high withstand capability intrinsic to nitride semiconductors.

DETAILED DESCRIPTION

According to one embodiment, a semiconductor device includes a first semiconductor layer, a second semiconductor layer, a third semiconductor layer, a first electrode, a second electrode, and a third electrode. The first semiconductor layer includes a nitride semiconductor. The second semiconductor layer is provided on the first semiconductor layer, the second semiconductor layer has a larger band gap than the first semiconductor layer, and the second semiconductor layer includes a nitride semiconductor. The third semiconductor layer is provided on the second semiconductor layer, the third semiconductor layer has a smaller band gap than the second semiconductor layer, and the third semiconductor layer includes a nitride semiconductor. The first electrode is provided on the second semiconductor layer, and the first electrode is in contact with the third semiconductor layer. The second electrode is provided on the second semiconductor layer, and the second electrode is in contact with the third semiconductor layer. And the third electrode is provided between the third semiconductor layer in contact with the first electrode, the second semiconductor layer directly below the first electrode, and the first semiconductor layer directly below the first electrode and the third semiconductor layer in contact with the second electrode, the second semiconductor layer directly below the second electrode, and the first semiconductor layer directly below the second electrode, the third electrode is in contact with the third semiconductor layer, the second semiconductor layer, and the first semiconductor layer via an insulating film, and the third electrode is not provided on the third semiconductor layer.

Embodiments will now be described with reference to the drawings. In the following description, like members are labeled with like reference numerals, and the description of the members once described is omitted appropriately.

First Embodiment

Figure 1A:
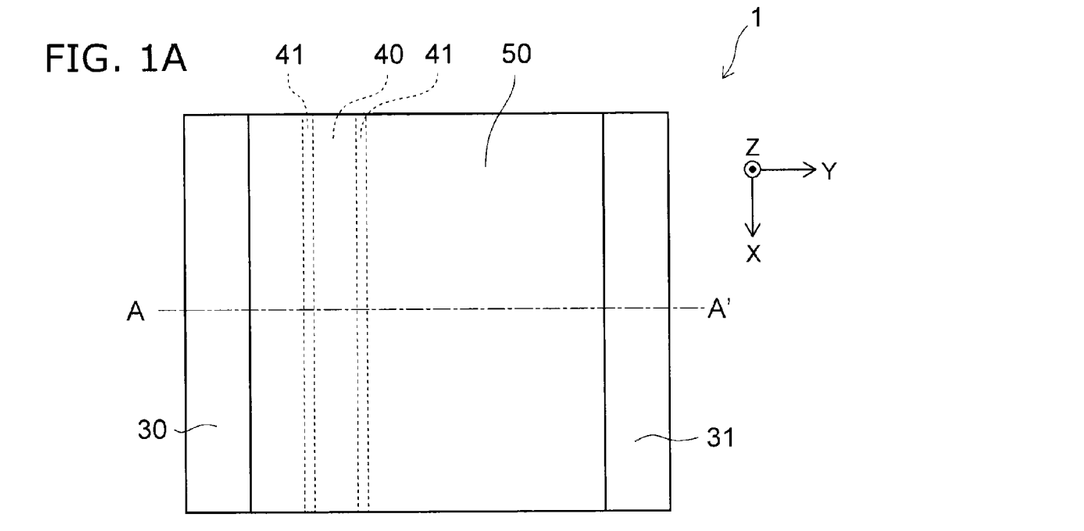
FIG. 1A is a schematic top view showing a semiconductor device according to a first embodiment.
Figure 1B:
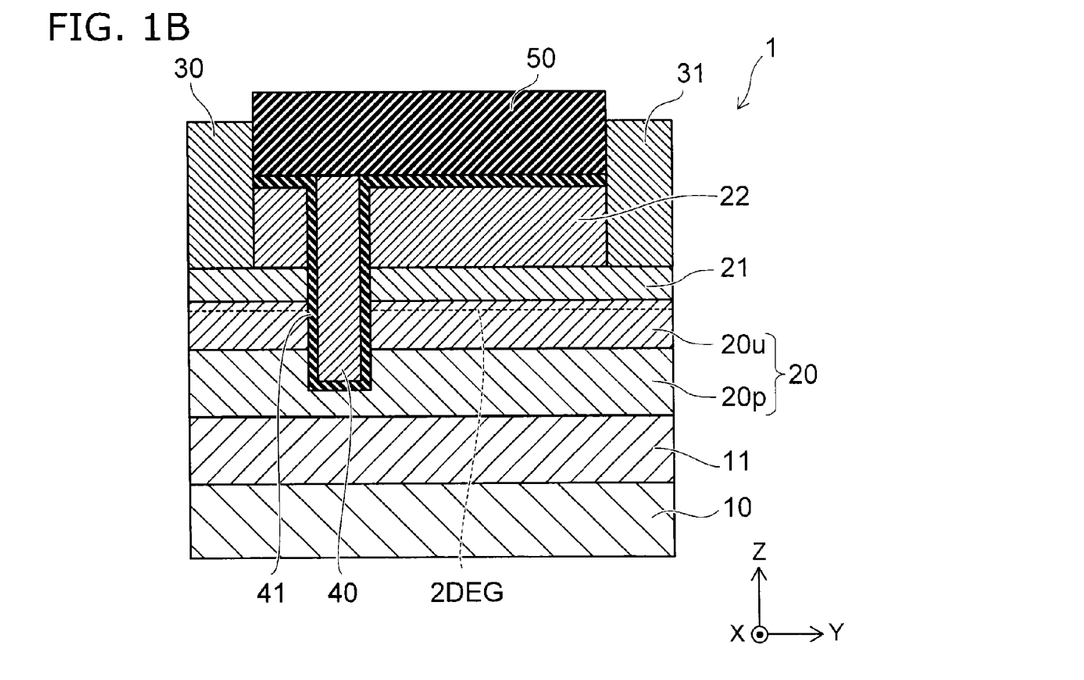
FIG. 1B is a schematic cross-sectional view showing the semiconductor device according to the first embodiment.

FIG. 1A is a schematic top view showing a semiconductor device according to a first embodiment. FIG. 1B is a schematic cross-sectional view showing the semiconductor device according to the first embodiment.

In FIGS. 1A and 1B, the direction from the source electrode 30 toward the drain electrode 31 is referred to as e.g. Y-direction. The direction from the semiconductor substrate 10 toward the semiconductor layer 22 is referred to as e.g. Z-direction. The X-direction, the Y-direction, and the Z-direction cross each other.

FIG. 1B shows a cross section taken along line A-A' of FIG. 1A.

The semiconductor device 1 according to the first embodiment includes a semiconductor substrate 10, a buffer layer 11, a semiconductor layer 20 (first semiconductor layer), a semiconductor layer 21 (second semiconductor layer), a semiconductor layer 22 (third semiconductor layer), a source electrode 30 (first electrode), a drain electrode 31 (second electrode), a gate electrode 40 (third electrode), and a gate insulating film 41 (insulating film).

The semiconductor substrate 10 is e.g. a silicon substrate. The semiconductor layer 20 includes a nitride semiconductor (e.g., GaN). The semiconductor layer 20 includes a semiconductor region 20u and a semiconductor region 20p. The semiconductor region 20u is provided on the semiconductor region 20p. The semiconductor region 20u includes an undoped nitride semiconductor (e.g., GaN). The semiconductor region 20p includes a nitride semiconductor. As an example, the semiconductor region 20p is made of p-type GaN. However, the semiconductor region 20p does not necessarily need to be of p-type. The buffer layer 11 is provided between the semiconductor substrate 10 and the semiconductor layer 20. The buffer layer 11 includes a nitride semiconductor (e.g., GaN).

The semiconductor layer 21 is provided on the semiconductor layer 20. The band gap of the semiconductor layer 21 is larger than the band gap of the semiconductor layer 20. The semiconductor layer 21 includes an undoped nitride semiconductor (e.g., AlGaN).

The semiconductor layer 22 is provided on the semiconductor layer 21. The band gap of the semiconductor layer 22 is smaller than the band gap of the semiconductor layer 21. The semiconductor layer 22 includes a nitride semiconductor. As an example, the semiconductor layer 22 is made of n-type GaN. However, the semiconductor layer 22 does not necessarily need to be of n-type.

The source electrode 30 is provided on the semiconductor layer 21. The source electrode 30 is in contact with the semiconductor layer 22. The drain electrode 31 is provided on the semiconductor layer 21. The drain electrode 31 is in contact with the semiconductor layer 22. The source electrode 30 and the drain electrode 31 are separated from each other.

The gate electrode 40 is provided between the semiconductor layer 22 in contact with the source electrode 30, the semiconductor layer 21 directly below the source electrode 30, and the semiconductor layer 20 directly below the source electrode 30 on one hand, and the semiconductor layer 22 in contact with the drain electrode 31, the semiconductor layer 21 directly below the drain electrode 31, and the semiconductor layer 20 directly below the drain electrode 31 on the other. The gate electrode 40 is in contact with the semiconductor layer 20, the semiconductor layer 21, and the semiconductor layer 22 via the gate insulating film 41. Here, the gate electrode 40 is not provided on the semiconductor layer 22. The source electrode 30, the drain electrode 31, and the gate electrode 40 extend in the X-direction. The gate insulating film 41 is provided also on the semiconductor layer 22. An insulating layer 50 is provided on the gate electrode 40 and on the gate insulating film 41.

The n-type impurity element contained in the nitride semiconductor is e.g. Si. The p-type impurity element is e.g. Mg.

In the semiconductor device 1, the semiconductor layer 20 and the semiconductor layer 21 form a heterojunction. A two-dimensional electron gas (2DEG) is generated near the interface between the semiconductor layer 20 and the semiconductor layer 21. Here, the thickness of the semiconductor layer 21 is set to 5 nm or more. This causes polarization near the interface between the semiconductor layer and the semiconductor layer 21, and generates a two-dimensional electron gas. The upper limit of the film thickness of the semiconductor layer 21 is set to the limit film thickness of epitaxial growth (e.g., 50 nm).

In the semiconductor device 1, the two-dimensional electron gas is divided by a trench structure composed of the gate electrode 40 and the gate insulating film 41. Thus, the semiconductor device 1 is what is called a normally-off semiconductor device.

Before describing the operation of the semiconductor device 1, the operation of a semiconductor device according to a reference example is described.

Figure 2A:
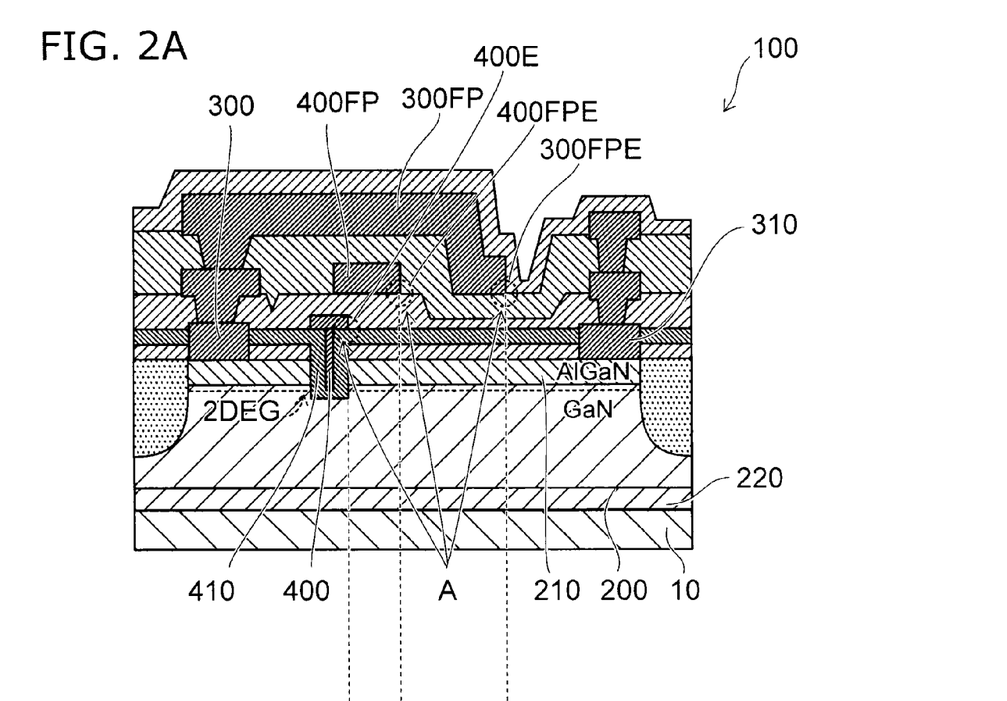
FIG. 2A is a schematic cross-sectional view showing a semiconductor device according to a reference example.
Figure 2B:
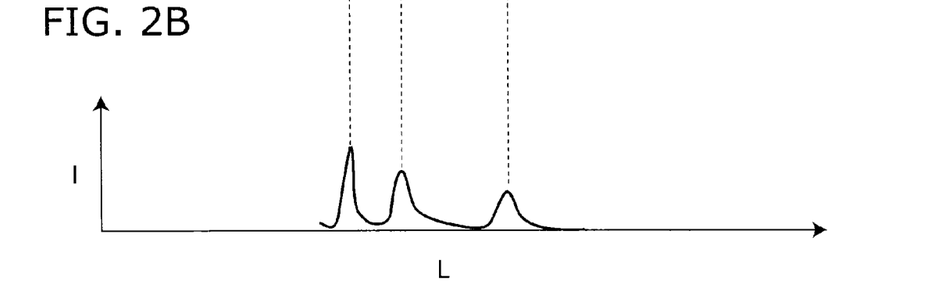
FIG. 2B shows the electric field intensity of the semiconductor device according to the reference example.

FIG. 2A is a schematic cross-sectional view showing a semiconductor device according to a reference example. FIG. 2B shows the electric field intensity of the semiconductor device according to the reference example.

In FIG. 2B, the horizontal axis represents length (L), and the vertical axis represents electric field intensity (I).

In the semiconductor device 100 according to the reference example, a GaN layer 200 is provided on the semiconductor substrate 10 via a buffer layer 220. An AlGaN layer 210 is provided on the GaN layer 200. The GaN layer 200 and the AlGaN layer 210 form a heterojunction. Thus, a two-dimensional electron gas (2DEG) is generated near the interface between the GaN layer 200 and the AlGaN layer 210.

In the semiconductor device 100, a source electrode 300 and a drain electrode 310 are provided on the AlGaN layer 210. A gate electrode 400 is provided between the source electrode 300 and the drain electrode 310. The gate electrode 400 is in contact with the GaN layer 200 and the AlGaN layer 210 via a gate insulating film 410.

In the semiconductor device 100, a field plate electrode 400FP is provided above the gate electrode 400 in order to prevent the current collapse phenomenon at off-state. The field plate electrode 400FP is electrically connected to the gate electrode 400. Furthermore, a field plate electrode 300FP is provided above the field plate electrode 400FP. The field plate electrode 300FP is electrically connected to the source electrode 300. In the semiconductor device 100, the gate electrode 400, the field plate electrode 400FP, and the field plate electrode 300FP each have a protrusion structure protruding to the drain electrode 310 side (the portion indicated by arrow A).

In the semiconductor device 100, a voltage is applied between the source and the drain. A potential higher than or equal to a threshold voltage (Vth) is applied to the gate electrode 400. Thus, a current flows between the source electrode 300 and the drain electrode 310.

However, the semiconductor device 100 has the aforementioned protrusion structure. Thus, at off-state, the electric field concentrates at the edge 400E of the gate electrode 400, the edge 400FPE of the field plate electrode 400FP, and the edge 300FPE of the field plate electrode 300FP.

Accordingly, as shown in FIG. 2B, the electric field intensity has a peak at the edge 400E of the gate electrode 400, the edge 400FPE of the field plate electrode 400FP, and the edge 300FPE of the field plate electrode 300FP.

Here, it is estimated that the breakdown voltage limit of the GaN crystal is e.g. 3 MV/cm (megavolts per centimeter) or more. However, if the electric field is locally enhanced between the gate and the drain, the gate-drain breakdown voltage may decrease to 100 V/μm or less. That is, the semiconductor device having a protrusion structure as in the reference example may fail to sufficiently exploit the breakdown voltage characteristics intrinsic to the GaN crystal.

Figure 3A:
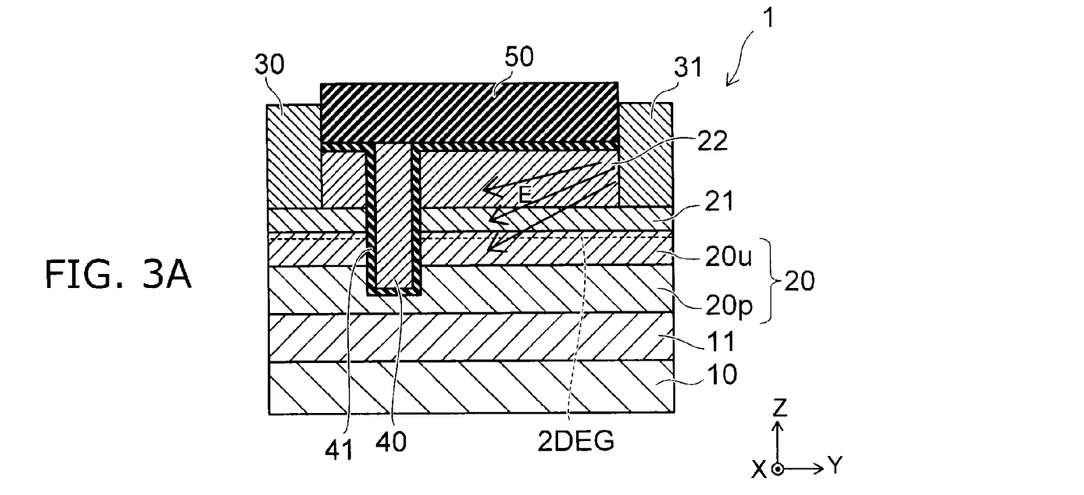
FIGS. 3A and 3C are schematic cross-sectional views showing the operation of the semiconductor device according to the first embodiment.
Figure 3B:
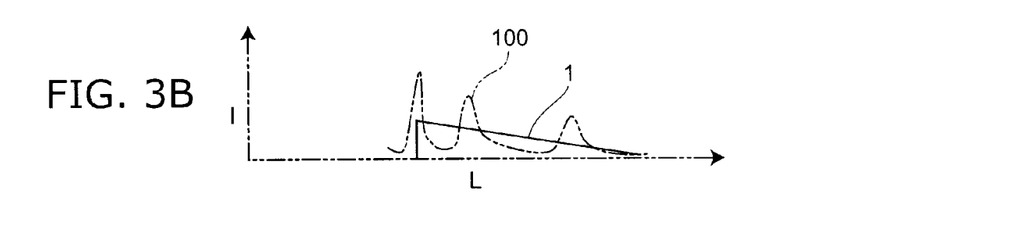
FIG. 3B shows the electric field intensity of the semiconductor device according to the first embodiment.
Figure 3C:
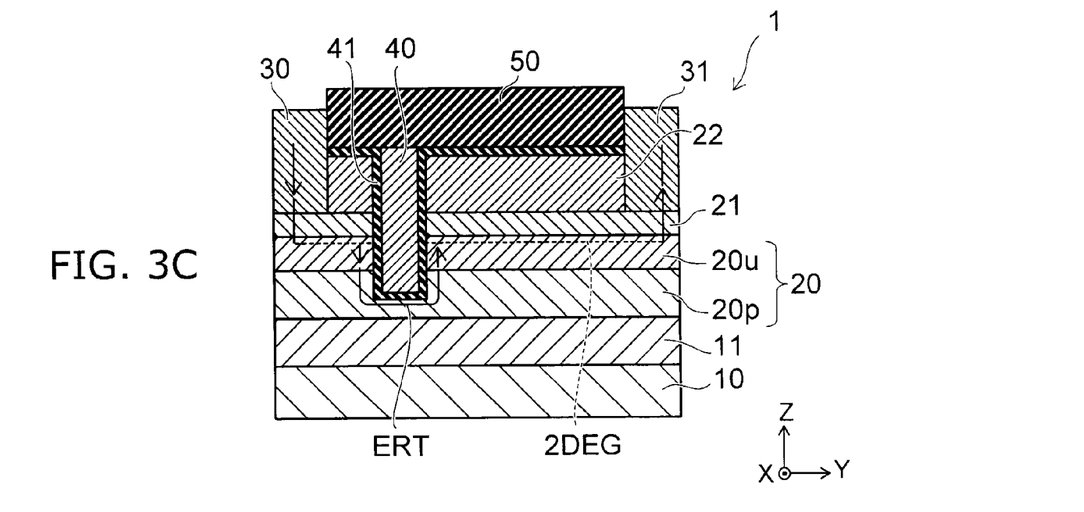

FIGS. 3A and 3C are schematic cross-sectional views showing the operation of the semiconductor device according to the first embodiment. FIG. 3B shows the electric field intensity of the semiconductor device according to the first embodiment.

The operation of the semiconductor device 1 is described.

FIG. 3A shows the state in which the drain electrode 31 is applied with a higher potential than the source electrode 30, and the gate electrode 40 is applied with a potential (first potential) lower than the threshold voltage (Vth). In this case, no current flows between the source electrode 30 and the drain electrode 31. That is, the two-dimensional electron gas (2DEG) is divided by the trench structure in the off-state.

The semiconductor device 1 does not have the aforementioned protrusion structure. Thus, the electric field E from the drain electrode 31 toward the gate electrode 40 is distributed uniformly in the Z-direction as indicated by arrows in the figure.

Here, FIG. 3B shows the electric field intensity in the off-state. In the semiconductor device 1, electric field concentration at the electrode edge is relaxed because of the absence of the protrusion structure. Thus, the electric field intensity of the semiconductor device 1 has no locally enhanced peak. The electric field intensity distribution is flatter than that of the reference example. Thus, the breakdown voltage of the semiconductor device 1 is determined by the physicality limit of the GaN crystal because the electric field intensity distribution is flatter. That is, the breakdown voltage of the semiconductor device is improved relative to the reference example.

Next, as shown in FIG. 3C, the gate electrode 40 is applied with a potential (second potential) higher than or equal to the threshold voltage (Vth) with the drain electrode 31 still applied with a higher potential than the source electrode 30. In this case, electrons are induced along the interface between the gate insulating film 41 and the semiconductor layer 20. That is, a channel region is formed along the interface between the gate insulating film 41 and the semiconductor layer 20.

Thus, the two-dimensional electron gas divided by the gate is linked with the induced electrons to form an electron current path ERT between the source electrode 30 and the drain electrode 31. Accordingly, a current flows between the source electrode 30 and the drain electrode 31.

In the semiconductor device 1, with the increase of its breakdown voltage, the spacing between the source electrode 30, the gate electrode 40, and the drain electrode 31 in the Y-direction can be narrowed. This can downsize the semiconductor device. Furthermore, the on-resistance of the semiconductor device is reduced by narrowing the source-drain spacing.

In the semiconductor device 1, the conductivity type of part (semiconductor region 20p) of the semiconductor layer 20 in contact with the gate electrode 40 via the gate insulating film is p-type. Thus, in the semiconductor device 1, the threshold voltage (Vth) of the gate electrode 40 is higher than that of the semiconductor device in which the semiconductor layer 20 is entirely a non-doped layer. That is, the first embodiment realizes a semiconductor device operated reliably in the normally-off mode.

Second Embodiment

Figure 4A:
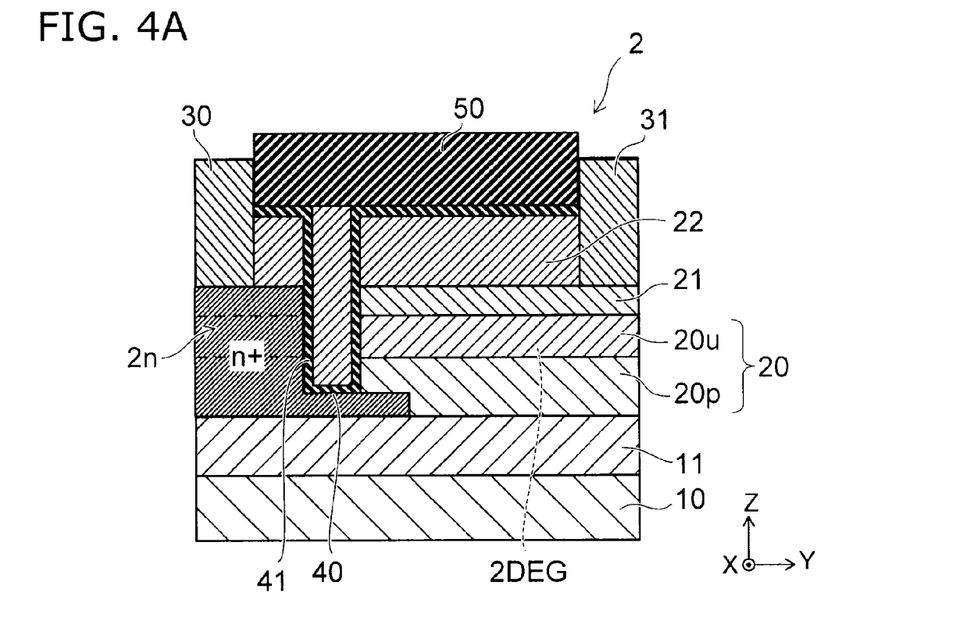
FIG. 4A is a schematic cross-sectional view showing a semiconductor device according to a second embodiment.
Figure 4B:
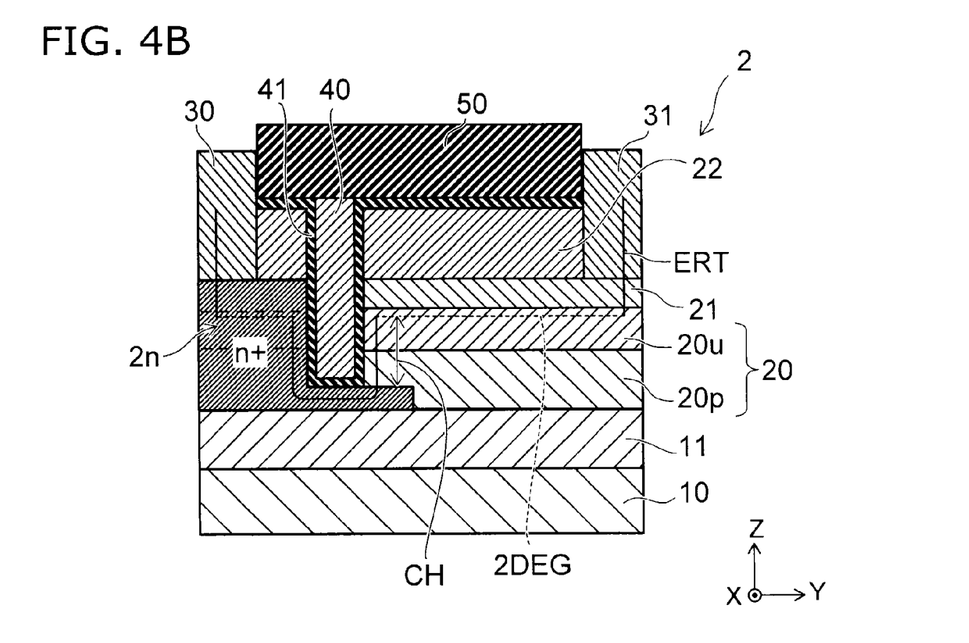
FIG. 4B shows the operation of the semiconductor device according to the second embodiment.

FIG. 4A is a schematic cross-sectional view showing a semiconductor device according to a second embodiment. FIG. 4B shows the operation of the semiconductor device according to the second embodiment.

In the semiconductor device 2 shown in FIG. 4A, the conductivity type of the region 2n shown in the figure is $n^+$-type. The region 2n includes the semiconductor layer 21 and the semiconductor layer 20 directly below the source electrode 30, the semiconductor layer 21 and the semiconductor layer 20 between the semiconductor layer 21 and the semiconductor layer 20 directly below the source electrode 30 on one hand and the gate electrode 40 on the other, and the semiconductor layer 20 directly below the gate electrode 40. Such a region 2n is formed by e.g. locally implanting an n-type impurity element into the region 2n.

The $n^+$-type region 2n is a low-resistance region for electrons. Furthermore, part of the electron current path ERT passes through the region 2n. That is, the semiconductor device 2 has an even lower on-resistance than the semiconductor device 1.

In FIG. 4A, only the region 2n is shown as an example. However, the semiconductor layer 22 between the source electrode 30 and the gate electrode 40 may be of $n^+$-type. Such a region having $n^+$-type conductivity further reduces the resistance of the electron current path ERT. Thus, the on-resistance is further reduced.

In the semiconductor device 2, no inversion layer is formed in the region 2n. A channel (channel CH in the figure) is formed along the interface between the gate insulating film 41 and the semiconductor layer 20 other than the region 2n. This results in a structure in which the channel region CH is opposed to the drain electrode 31. Thus, the electric field from the drain electrode 31 toward the channel region CH is distributed in the channel region CH. Accordingly, local electric field is less likely to be applied to the channel region CH. This reliably suppresses the off-state leakage current.

Third Embodiment

Figure 5A:
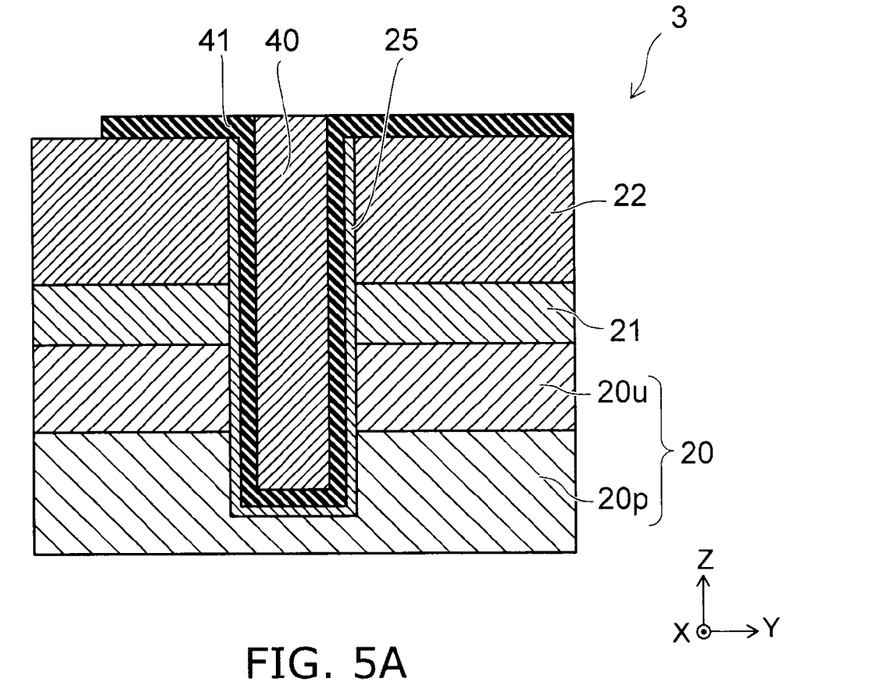
FIG. 5A is a schematic cross-sectional view showing a semiconductor device according to a third embodiment.
Figure 5B:
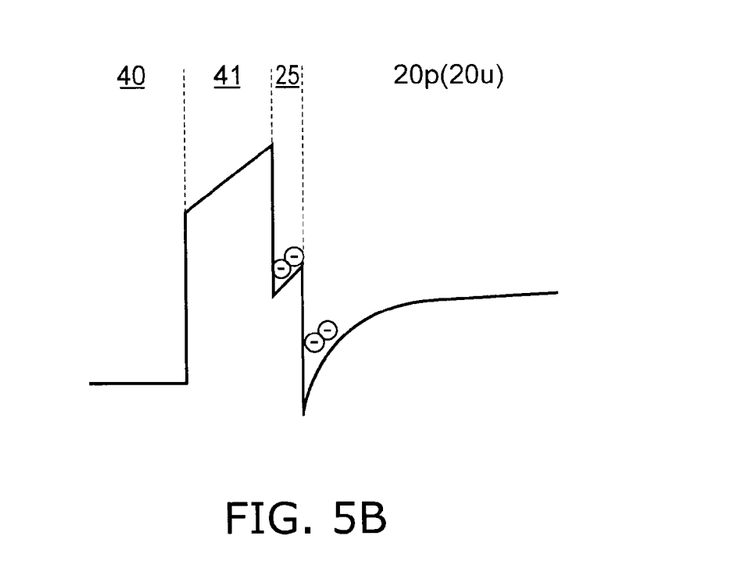
FIG. 5B shows an energy band of the semiconductor device according to the third embodiment.

FIG. 5A is a schematic cross-sectional view showing a semiconductor device according to a third embodiment. FIG. 5B shows the energy band of the semiconductor device according to the third embodiment.

FIG. 5A shows the structure near the gate electrode 40. FIG. 5B shows the energy band near the gate electrode 40 at on-state.

In the semiconductor device 3 shown in FIG. 5A, a semiconductor layer 25 (fourth semiconductor layer) is provided between the gate insulating film 41 and the semiconductor layer 20. The semiconductor layer 25 includes a nitride semiconductor (e.g., AlGaN). The band gap of the semiconductor layer 25 is larger than the band gap of the semiconductor layer 20. The semiconductor layer 25 is formed by e.g. epitaxial growth.

In the semiconductor device 3, a heterojunction is formed also in the channel region. A two-dimensional electron gas (2DEG) is generated also in the channel region. At on-state, electrons are induced near the interface between the gate insulating film 41 and the semiconductor layer 25, or near the interface between the semiconductor layer 20 and the semiconductor layer 25 (FIG. 5B).

In the semiconductor device 3, the two-dimensional electron gas (2DEG) generated in the channel region enhances the electron confinement effect in the channel region compared with the semiconductor devices 1 and 2. This further reduces the channel resistance and further increases the electron mobility in the channel region.

Fourth Embodiment

Figure 6:
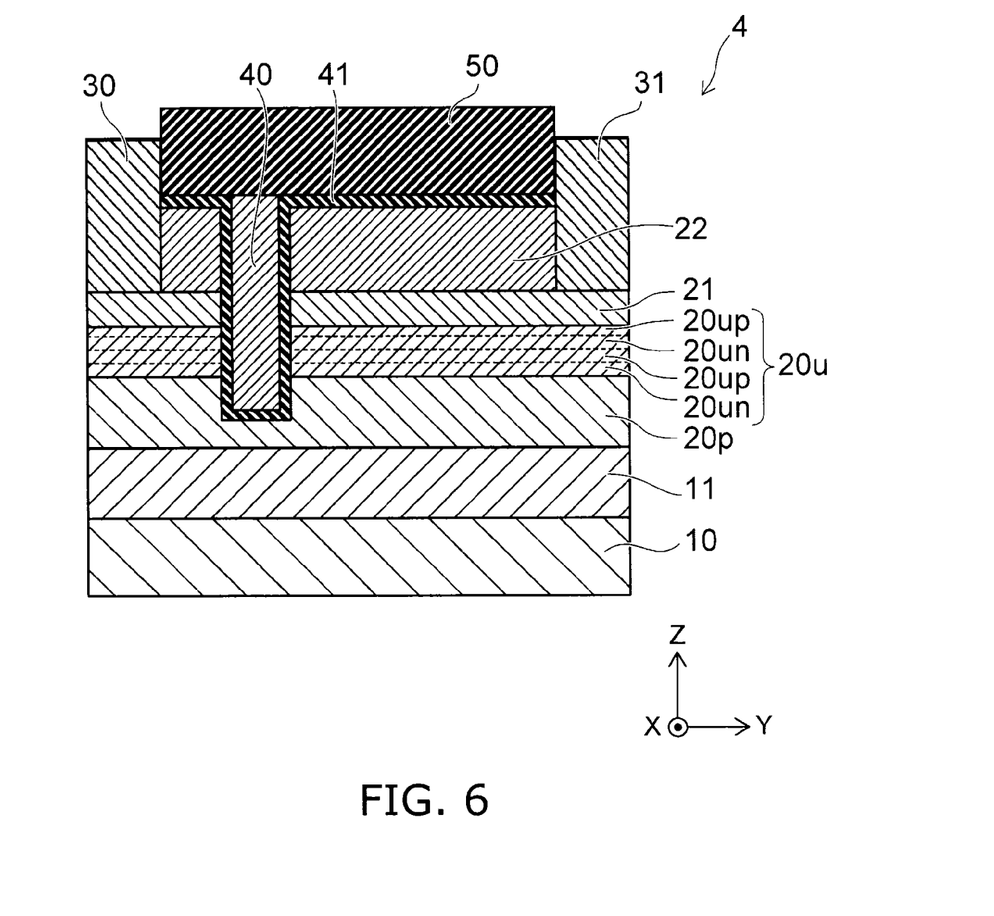
FIG. 6 is a schematic cross-sectional view showing a semiconductor device according to a fourth embodiment.

FIG. 6 is a schematic cross-sectional view showing a semiconductor device according to a fourth embodiment.

The semiconductor device 4 according to the fourth embodiment includes a superjunction structure in the portion of the semiconductor layer 20 other than the semiconductor region 20p.

For instance, the semiconductor region 20u on the upper side of the semiconductor layer 20 has a structure in which semiconductor regions 20un and semiconductor regions 20up are alternately arranged in the direction (Z-direction) from the semiconductor layer 20 toward the semiconductor layer 22.

Here, the semiconductor region 20un is an n-type GaN-containing layer. The semiconductor region 20up is a p-type GaN-containing layer. Alternatively, the semiconductor region 20un may be an n-type AlGaN-containing layer. The semiconductor region 20up may be a p-type AlGaN-containing layer.

Alternatively, the semiconductor region 20un may be a GaN-containing layer. The semiconductor region 20up may be an AlGaN-containing layer. In this case, the GaN-containing layer and the AlGaN-containing layer contain no impurity element. However, because of the heterojunction of the GaN-containing layer and the AlGaN-containing layer, one is negatively charged, and the other is positively charged. This virtually forms an alternate arrangement of n-type regions and p-type regions in the Z-direction without introducing an impurity element.

In the superjunction structure thus provided, at off-state, a depletion layer extends from the junction part of the semiconductor region 20un and the semiconductor region 20up into both the semiconductor region 20un and the semiconductor region 20up. The extended depletion layers are linked in the semiconductor region 20un and in the semiconductor region 20up. Thus, the semiconductor region 20u is entirely depleted. That is, at off-state, an electrically neutral semiconductor region 20u stably exists between the gate and the drain. Thus, the breakdown voltage of the semiconductor device 4 is further increased relative to the breakdown voltage of the semiconductor devices 1-3.

Here, each thickness of the n-type AlGaN-containing layer, the p-type AlGaN-containing layer, and the AlGaN-containing layer in the superjunction structure is set to e.g. 5 nm or more and 50 nm or less. In FIG. 6, the semiconductor region 20u having a four-layer structure is shown. However, the number of layers is not limited thereto.

Fifth Embodiment

Figure 7A:
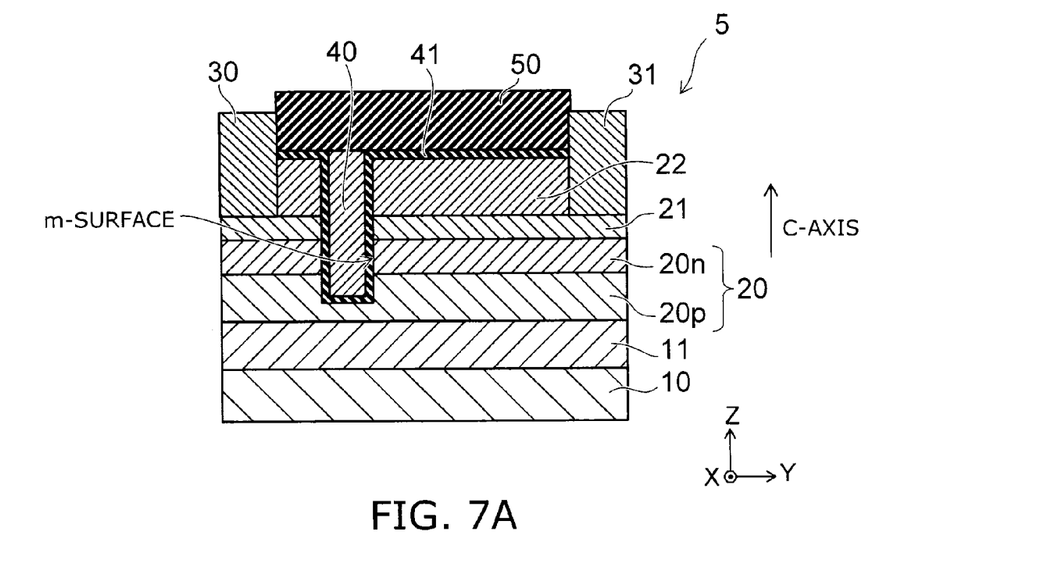
FIG. 7A is a schematic cross-sectional view showing a semiconductor device according to a fifth embodiment.
Figure 7B:
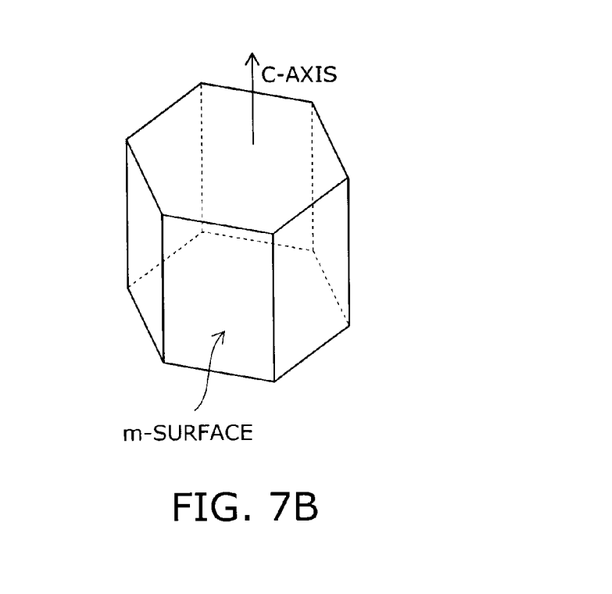
FIG. 7B shows the crystal structure of a GaN crystal.

FIG. 7A is a schematic cross-sectional view showing a semiconductor device according to a fifth embodiment. FIG. 7B shows the crystal structure of a GaN crystal.

In the semiconductor device 5 according to the fifth embodiment, the C-axis of the GaN crystal included in the semiconductor layer 20 is directed in the direction (Z-direction) from the semiconductor layer 20 toward the semiconductor layer 22. Furthermore, the surface of the GaN crystal in contact with the gate electrode 40 via the gate insulating film 41 is the m-surface of the GaN crystal.

Here, the m-surface of the GaN crystal is a non-polar surface. A two-dimensional electron gas (2DEG) is less likely to be generated near the interface between the m-surface and the gate insulating film 41. Thus, the off-state leakage current can be reliably suppressed.

Sixth Embodiment

Figure 8A:
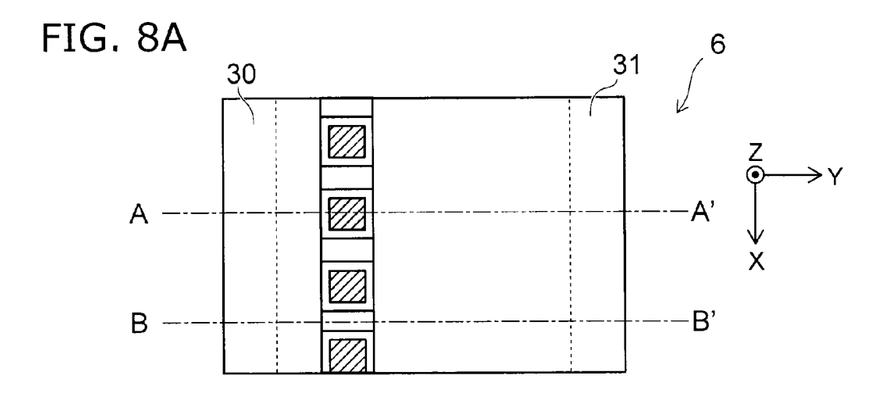
FIG. 8A is a schematic top view showing a semiconductor device according to a sixth embodiment.
Figure 8B:
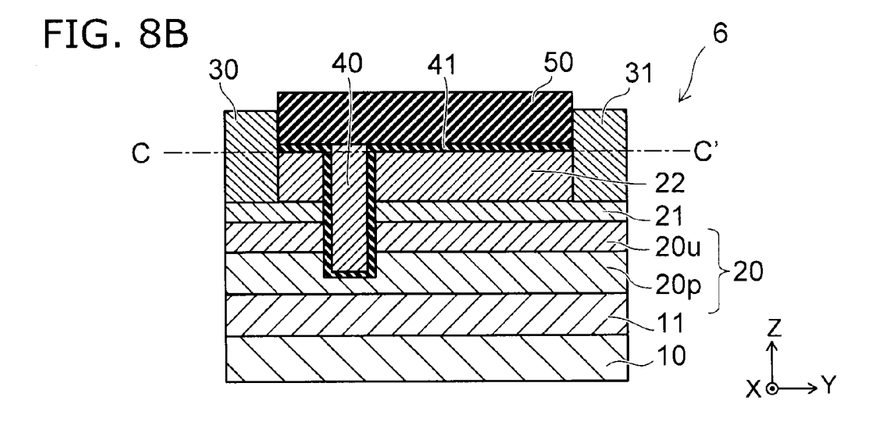
FIGS. 8B and 8C are schematic cross-sectional views showing the semiconductor device according to the sixth embodiment.
Figure 8C:
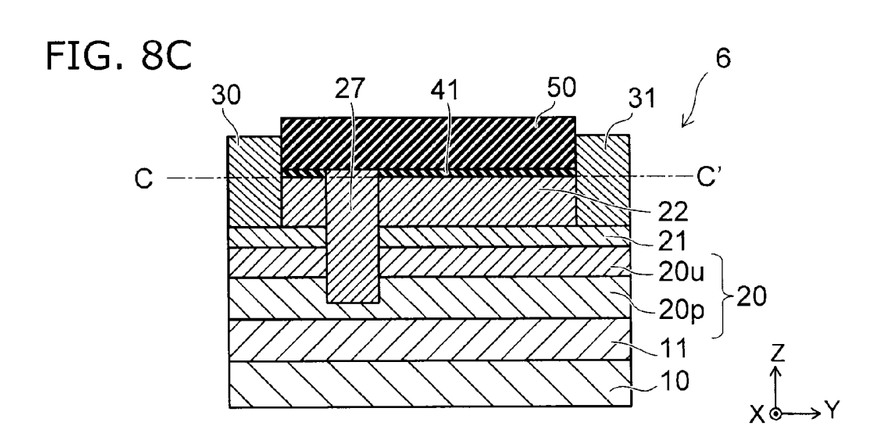

FIG. 8A is a schematic top view showing a semiconductor device according to a sixth embodiment. FIGS. 8B and 8C are schematic cross-sectional views showing the semiconductor device according to the sixth embodiment.

FIG. 8A shows a cross section taken along line C-C' of FIGS. 8B and 8C. FIG. 8B shows a cross section taken along line A-A' of FIG. 8A. FIG. 8C shows a cross section taken along line B-B' of FIG. 8A.

In the semiconductor device 6 according to the sixth embodiment, a plurality of gate electrodes 40 are arranged in the X-direction. A semiconductor layer 27 (fifth semiconductor layer) is provided between the adjacent gate electrodes 40. The semiconductor layer 27 includes a nitride semiconductor (e.g., GaN). The semiconductor layer 27 is linked to the semiconductor layer 22, the semiconductor layer 21, and the semiconductor layer 20.

In the semiconductor device 6, the electron current flowing between the source and the drain flows also through the semiconductor layer 27. This further reduces the on-resistance.

Seventh Embodiment

The material of the gate electrode 40 may be polysilicon. Alternatively, the material of the gate electrode 40 may be e.g. a metal material having higher work function, or diamond having higher work function. Thus, the threshold voltage (Vth) of the gate electrode 40 is further increased. This realizes a semiconductor device operated more reliably in the normally-off mode. The semiconductor layer 21 may include InAlGaN. InAlGaN has a higher polarization constant than AlGaN. That is, a larger amount of two-dimensional electron gas is generated near the interface between the semiconductor layer 20 and the semiconductor layer 21 by using InAlGaN. This further reduces the on-resistance.

Eighth Embodiment

Figure 9:
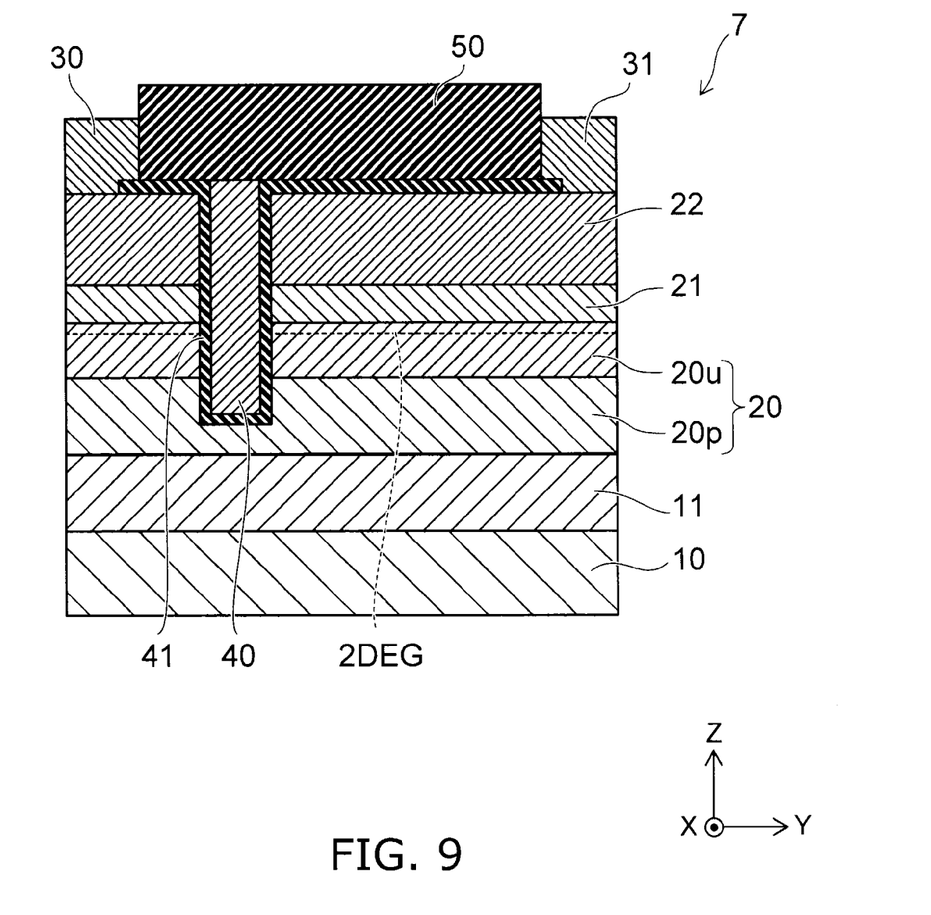
FIG. 9 is a schematic cross-sectional view of a semiconductor device according to an eighth embodiment.

FIG. 9 is a schematic cross-sectional view of a semiconductor device according to an eighth embodiment.

In the semiconductor device 7 shown in FIG. 9, the source electrode 30 and the drain electrode 31 are in contact with the semiconductor layer 21, 22. However, as shown in FIG. 9, the source electrode 30 and the drain electrode 31 may be provided on the semiconductor layer 22. The gate electrode is provided between the semiconductor layer 22, the semiconductor layer 21, and the semiconductor layer 20 directly below the source electrode 30 on one hand, and the semiconductor layer 22, the semiconductor layer 21, and the semiconductor layer 20 directly below the drain electrode 31. The gate electrode 40 is in contact with the semiconductor layer 20, the semiconductor layer 21, and the semiconductor layer 22 via the gate insulating film 41. Such a structure is also applicable to the aforementioned semiconductor devices 2-6.

In the semiconductor device, the region 2n as in the semiconductor device 2 may be formed. The semiconductor layer 22 directly below the source electrode 30, and the semiconductor layer 22 between the semiconductor layer 22 directly below the source electrode 30 and the gate electrode 40, may be further set to $n^+$-type.

In the embodiments described above, the term "on" in "a portion A is provided on a portion B" may refer to not only the case where the portion A is provided on the portion B such that the portion A is in contact with the portion B but also the case where the portion A is provided above the portion B such that the portion A is not in contact with the portion B. Furthermore, "a portion A is provided on a portion B" may refer to the case where the portion A and the portion B are inverted and the portion A is located below the portion B and the case where the portion A and the portion B are laterally juxtaposed. This is because, even when the semiconductor device according to the embodiment is rotated, the structure of the semiconductor device is not changed by the rotation.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a first electrode;
   a second electrode apart from the first electrode in a first direction;
   a first semiconductor layer including a nitride semiconductor, the first semiconductor layer including a first region and a second region, the first region being apart from the first electrode in a second direction crossing the first direction, the second region being apart from the second electrode in the second direction;
   a second semiconductor layer including a third region and a fourth region, the third region being provided between the first electrode and the first region in the second direction, the fourth region being provided between the second electrode and the second region, the second semiconductor layer having a second band gap larger than a band gap of the first semiconductor layer, the second semiconductor layer including a nitride semiconductor;
   a third electrode provided between at least a part of the first region and at least a part of the second region in the first direction, between the third region and the fourth region in the first direction, and between the first electrode and the second electrode in the first direction;
   a third semiconductor layer including a fifth region and a sixth region, the fifth region being provided between the first electrode and the third electrode in the first direction, the sixth region being provided between the second electrode and the third electrode in the first direction, the third semiconductor layer having a third band gap smaller than the second band gap, the third semiconductor layer including a nitride semiconductor, the third semiconductor not overlapping the third electrode in the second direction; and
   an insulating film provided at first to sixth positions, the first position being between the at least a part of the first region and the third electrode in the first direction, the second position being between the at least a part of the second region and the third electrode in the first direction, the third position being between the third region and the third electrode in the first direction, the fourth position being between the fourth region and the third electrode in the first direction, the fifth position being between the fifth region and the third electrode in the first direction, the sixth region being between the sixth region and the third electrode in the first direction,
   wherein
   the first semiconductor layer includes GaN,
   the second semiconductor layer includes AlGaN,
   the third semiconductor layer includes GaN,
   the second region includes a first semiconductor region and a second semiconductor region,
   the second semiconductor region is located between the first semiconductor region and the fourth region,
   the first semiconductor region includes a p-type impurity, and
   a concentration of the p-type impurity in the second semiconductor region is lower than a concentration of the p-type impurity in the first semiconductor region.

2. The device according to claim 1, wherein
   a current does not flow between the first electrode and the second electrode in a first state, a potential of the second electrode is higher than a potential of the first electrode in the first state, and the third electrode has a first potential in the first state, and
   a current flows between the first electrode and the second electrode in a second state, a potential of the third electrode is higher than the first potential in the second state.

3. The device according to claim 1, wherein a conductivity type of a region is n-type, the region including:
   the second semiconductor layer and the first semiconductor layer directly below the first electrode,
   the second semiconductor layer and the first semiconductor layer between the second semiconductor layer and the first semiconductor layer directly below the first electrode and the third electrode, and
   the first semiconductor layer directly below the third electrode.

4. The device according to claim 1, wherein a conductivity type of the third semiconductor layer between the first electrode and the third electrode is n-type.

5. The device according to claim 1, further comprising:
   a fourth semiconductor layer between the insulating film and the first semiconductor layer, the fourth semiconductor layer having a band gap larger than a band gap of the first semiconductor layer, and the fourth semiconductor layer including a nitride semiconductor.

6. The device according to claim 1, wherein the first semiconductor layer other than the part of the first semiconductor layer includes a superjunction structure.

7. The device according to claim 6, wherein the superjunction structure includes a structure, and n-type GaN-containing layers and p-type GaN-containing layers are alternately arranged in the structure in the second direction.

8. The device according to claim 6, wherein the superjunction structure includes a structure, and n-type AlGaN-containing layers and p-type AlGaN-containing layers are alternately arranged in the structure in the second direction.

9. The device according to claim 6, wherein the superjunction structure includes a structure, and AlGaN-containing layers and GaN-containing layers are alternately arranged in the structure in the second direction.

10. The device according to claim 1, wherein the second semiconductor layer has a thickness of 5 nm or more and 50 nm or less.

11. The device according to claim 1, wherein the first semiconductor layer includes a GaN crystal, and a surface of the GaN crystal in contact with the third electrode via the insulating film is an m-surface of the GaN crystal.

12. The device according to claim 1, wherein
a part the insulating film is located between a part of first semiconductor layer and the third electrode in the second direction.

13. The device according to claim 1, further comprising:
an insulating layer,
the fifth region is located between a part of the insulating layer and a part of the second semiconductor layer in the second direction,
the sixth region is located between another part of the insulating layer and another part the second semiconductor layer in the second direction,
a part of the insulating film is further provided between the part of the insulating layer and the part of the second semiconductor layer in the second direction and directly contacting the part of the insulating layer and the part of the second semiconductor layer, and
another part of the insulating film is further provided between the another part of the insulating layer and the another part of the second semiconductor layer in the second direction and directly contacting the another part of the insulating layer and the another part of the second semiconductor layer.

14. The device according to claim 1, wherein
the insulating film includes:
a first partial region located at the first position,
a second partial region located at the second position,
a third partial region located at the third position,
a fourth partial region located at the fourth position,
a fifth partial region located at the fifth position, and
a sixth partial region located at the sixth position,
in the second direction, the third electrode does not overlap the first partial region, the second partial region, the third partial region, the fourth partial region, the fifth partial region, and the sixth partial region.

15. The device according to claim 14, wherein the second semiconductor region is undoped GaN.

16. A semiconductor device comprising:
a first electrode;
a second electrode apart from the first electrode in a first direction;
a first semiconductor layer including a nitride semiconductor, the first semiconductor layer including a first region and a second region, the first region being apart from the first electrode in a second direction crossing the first direction, the second region being apart from the second electrode in the second direction;
a second semiconductor layer including a third region and a fourth region, the third region being provided between the first electrode and the first region in the second direction, the fourth region being provided between the second electrode and the second region, the second semiconductor layer having a second band gap larger than a band gap of the first semiconductor layer, the second semiconductor layer including a nitride semiconductor;
a third electrode provided between at least a part of the first region and at least a part of the second region in the first direction, between the third region and the fourth region in the first direction, and between the first electrode and the second electrode in the first direction;
a third semiconductor layer including a fifth region and a sixth region, the fifth region being provided between the first electrode and the third electrode in the first direction, the sixth region being provided between the second electrode and the third electrode in the first direction, the third semiconductor layer having a third band gap smaller than the second band gap, the third semiconductor layer including a nitride semiconductor;
an insulating film provided at first to sixth positions, the first position being between the at least a part of the first region and the third electrode in the first direction, the second position being between the at least a part of the second region and the third electrode in the first direction, the third position being between the third region and the third electrode in the first direction, the fourth position being between the fourth region and the third electrode in the first direction, the fifth position being between the fifth region and the third electrode in the first direction, the sixth region being between the sixth region and the third electrode in the first direction; and
an insulating layer,
the fifth region being located between a part of the insulating layer and a part of the second semiconductor layer in the second direction,
the sixth region being located between another part of the insulating layer and another part the second semiconductor layer in the second direction,
a part of the insulating film being further provided between the part of the insulating layer and the part of the second semiconductor layer in the second direction and directly contacting the part of the insulating layer and the part of the second semiconductor layer, and
another part of the insulating film being further provided between the another part of the insulating layer and the another part of the second semiconductor layer in the second direction and directly contacting the another part of the insulating layer and the another part of the second semiconductor layer,
wherein
the first semiconductor layer includes GaN,
the second semiconductor layer includes AlGaN,
the third semiconductor layer includes GaN,
the second region includes a first semiconductor region and a second semiconductor region,
the second semiconductor region is located between the first semiconductor region and the fourth region,
the first semiconductor region includes a p-type impurity, and
a concentration of the p-type impurity in the second semiconductor region is lower than a concentration of the p-type impurity in the first semiconductor region.

* * * * *